(12) United States Patent
Werner et al.

(10) Patent No.: US 9,349,641 B2
(45) Date of Patent: May 24, 2016

(54) WAFER WITH IMPROVED PLATING CURRENT DISTRIBUTION

(71) Applicant: GLOBALFOUNDRIES Inc., Grand Cayman (KY)

(72) Inventors: Thomas Werner, Reichenberg-Moritzburg (DE); Oliver Aubel, Dresden (DE); Frank Feustel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/487,250

(22) Filed: Sep. 16, 2014

(65) Prior Publication Data

US 2016/0079116 A1    Mar. 17, 2016

(51) Int. Cl.
| | |
|---|---|
| *H01L 21/44* | (2006.01) |
| *H01L 21/768* | (2006.01) |
| *H01L 27/02* | (2006.01) |
| *H01L 23/528* | (2006.01) |
| *H01L 21/56* | (2006.01) |

(52) U.S. Cl.
CPC .......... *H01L 21/76879* (2013.01); *H01L 21/56* (2013.01); *H01L 23/528* (2013.01); *H01L 27/0248* (2013.01)

(58) Field of Classification Search
CPC .................................................. H01L 21/76805
USPC .................................................. 438/599, 621
See application file for complete search history.

(56) References Cited

U.S. PATENT DOCUMENTS

| | | | | |
|---|---|---|---|---|
| 6,614,092 B2* | 9/2003 | Eldridge | ............. | H01L 21/7682 257/506 |
| 6,946,325 B2* | 9/2005 | Yean | .................. | H01L 23/5389 438/458 |
| 7,208,758 B2* | 4/2007 | Lunde | .................. | G11C 29/006 257/48 |

* cited by examiner

*Primary Examiner* — Chandra Chaudhari
(74) *Attorney, Agent, or Firm* — Amerson Law Firm, PLLC

(57) ABSTRACT

A semiconductor wafer is provided including a plurality of dies, each of the plurality of dies including a plurality of semiconductor devices, a plurality of die seals, each of the plurality of die seals being formed at a perimeter of one of the plurality of dies, and a plurality of electrically conductive links, each of the plurality of conductive links connecting one of the plurality of die seals with another one of the plurality of die seals.

18 Claims, 5 Drawing Sheets

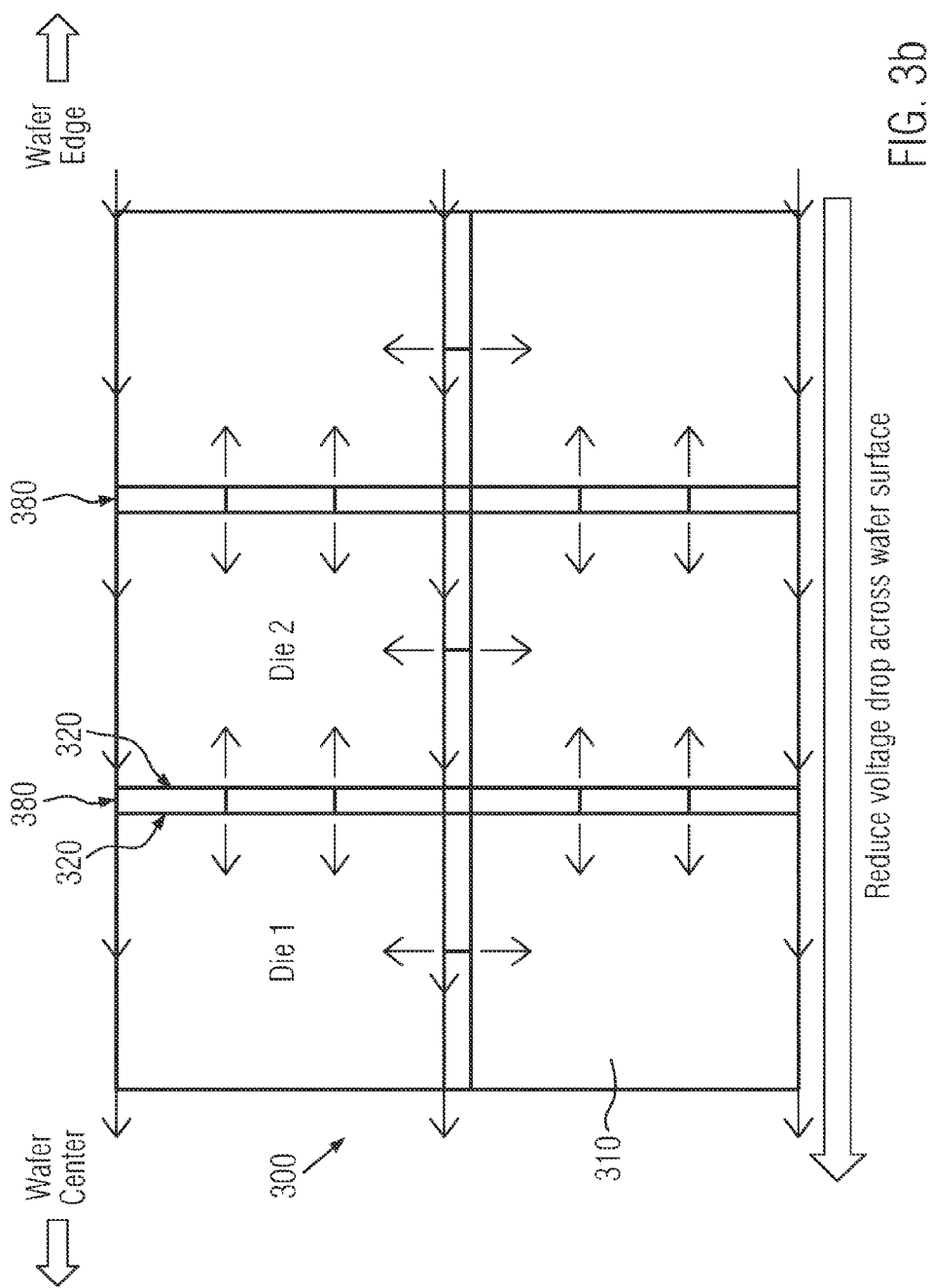

WAFER WITH IMPROVED PLATING CURRENT DISTRIBUTION

BACKGROUND OF THE INVENTION

1. Field of the Invention

Generally, the present disclosure relates to the field of integrated circuits, and, more particularly, the plating of wafers within Back-End-Of-Line (BEOL) processing.

2. Description of the Related Art

Integrated circuits formed on semiconductor wafers typically include a large number of circuit elements, which form an electric circuit. In addition to active devices such as, for example, field effect transistors and/or bipolar transistors, integrated circuits can include passive devices such as resistors, inductors and/or capacitors.

The semiconductor manufacturing process typically includes two major components, namely the Front-End-of-Line (FEOL), which includes the multilayer process of forming semiconductor devices (transistors, etc.) on a semiconductor substrate, and the Back-End-Of-Line (BEOL), which includes the metallization after the semiconductor devices have been formed. Like all electronic devices, semiconductor devices in a microchip, such as an integrated circuit (IC), need to be electronically connected through wiring. In an integrated circuit, such wiring is done through multilayer metallization on top of the multilayered semiconductor devices formed on the semiconductor substrate. The complexity of this wiring becomes appreciable as there may be hundreds of millions or more semiconductor devices (e.g., transistors in particular) formed on a single IC. Proper connection of these devices is accomplished by multilayer metallization. Each metallization layer consists of a grid of metal lines sandwiched between one or more dielectric layers for electrical integrity. In fact, manufacturing processes can involve multiple metallization layers.

The interconnects in an integrated circuit represent a dominant factor in determining system performance and power dissipation. Thus, improving the functionality and performance capability of various metallization systems has become important in designing modern semiconductor devices. One example of such improvements is the enhanced use of copper metallization systems in integrated circuit devices and the use of so-called "low-k" dielectric materials (materials having a dielectric constant less than 3) in such devices. Copper metallization systems/interconnects exhibit improved electrical conductivity as compared to, for example, prior art metallization systems using aluminum for the conductive lines and vias. Using a lower resistivity interconnect material decreases the interconnect RC delay which, in turn, increases the operation speed of the integrated circuit. The use of low-k dielectric materials also tends to improve the signal-to-noise ratio (S/N ratio) by reducing crosstalk as compared to other dielectric materials with higher dielectric constants.

Copper is a material that is difficult to etch using traditional masking and etching techniques. Thus, conductive copper structures, e.g., conductive lines or vias, in modern integrated circuit devices are typically formed using known single or dual damascene techniques. In general, the damascene technique involves (1) forming a trench/via in a layer of insulating material, (2) depositing one or more relatively thin barrier layers, (3) forming copper material across the substrate and in the trench/via, and (4) performing a chemical mechanical polishing process to remove the excess portions of the copper material and the barrier layer positioned outside of the trench/via to define the final conductive copper structure. The copper material is typically formed by performing an electrochemical copper deposition process (copper plating) after a thin conductive (for example, copper) seed layer is deposited by physical vapor deposition on a barrier layer.

However, in advanced semiconductor nodes, the conductive seed layer deposited prior to copper plating is formed as a very thin layer, providing a relatively high electrical resistivity. This leads to a high lateral resistance gradient over the wafer to be plated which, in turn, may result in relatively poor plating conditions, particularly in the center of the wafer. FIGS. 1a and 1b illustrate the problem of a voltage drop arising across a wafer surface due to the lateral resistance gradient caused by resistive current paths on the surface of a wafer in an electrochemical plating bath. As shown in the top view of FIG. 1a, a wafer 100 comprising multiple dies 110 separated from each other by die seals 120 exhibits a voltage drop in a plating both from the wafer surface to the wafer center due to highly resistive portions of current paths on the surface of the wafer to be plated.

As shown in FIG. 1b, the wafer may have a network of conducting structures 130 in form of electrical contacts connecting to semiconductor devices, for example, as transistors, memory cells, etc. The conducting structures 130 may be formed in a stack of metallization layers 140. The wafer shown in FIG. 1a comprises a top layer 150 comprising some dielectric material. Particularly, the top layer 150 has openings, vias or trenches 160 that, for example, may be formed in the context of dual-damascene processing. The opening, vias or trenches 160 are coated by some seed layer 170. In particular, between the die seals 120, a highly resistive current path results on the surface of the wafer 100. Current flow during a process of copper plating in a plating bath is indicated in FIG. 1b by the arrows and the letter "I". However, particularly across the die seals 120, a highly resistive current path forms that inhibits a homogeneous current distribution during electroplating and, thus, a significant voltage drop across the semiconductor wafer resulting in inhomogeneous plating conditions.

The present disclosure provides an enhanced wafer structure with respect to the distribution of plating currents applied to the surface of a wafer, as well as a method of manufacturing such a semiconductor wafer.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative semiconductor wafer includes a plurality of dies, each of the plurality of dies comprising a plurality of semiconductor devices (comprising, for example, field effect transistors), a plurality of die seals, each of the plurality of die seals being formed at a perimeter of one of the plurality of dies, and a plurality of electrically conductive links, each of the plurality of conductive links connecting one of the plurality of die seals with another one of the plurality of die seals. Thus, individual dies (die seals) are electrically connected to each other by means of electrically conductive links made of an electrically conductive material, for example, made of copper, aluminum, tungsten or any alloy thereof. Thereby, resistive paths between the dies can be avoided and a homogeneous distribution of a current applied to the wafer surface during a plating process can be achieved.

An illustrative method of manufacture of a semiconductor wafer includes the steps of forming a first integrated circuit on a first die of the semiconductor wafer and forming a second integrated circuit on a second die of the semiconductor wafer, forming a first die seal at the perimeter of the first die and a second die seal at the perimeter of the second die, and forming an electrically conductive link between the first and the second die seals.

An illustrative method of electroplating a semiconductor wafer includes the steps of providing a semiconductor wafer comprising a plurality of dies, each of the plurality of dies comprising a plurality of semiconductor devices, a plurality of die seals, each of the plurality of die seals being formed at a perimeter of one of the plurality of dies, and a plurality of electrically conductive links, each of the plurality of conductive links connecting one of the plurality of die seals with another one of the plurality of die seals. Furthermore, the method includes the steps of immersing the semiconductor wafer in an electrolyte bath containing copper, applying a cathode to an edge of the semiconductor wafer, immersing an anode in the electrolyte bath, and applying a voltage to at least one of the cathode and anode to deposit a copper-based material on the surface of the semiconductor wafer.

BRIEF DESCRIPTION OF THE DRAWINGS

The disclosure may be understood by reference to the following description taken in conjunction with the accompanying drawings, in which like reference numerals identify like elements, and in which:

FIGS. 3a and 3b show an example of an inventive wafer comprising electrically conductive links between die seals.

Figure 1A:
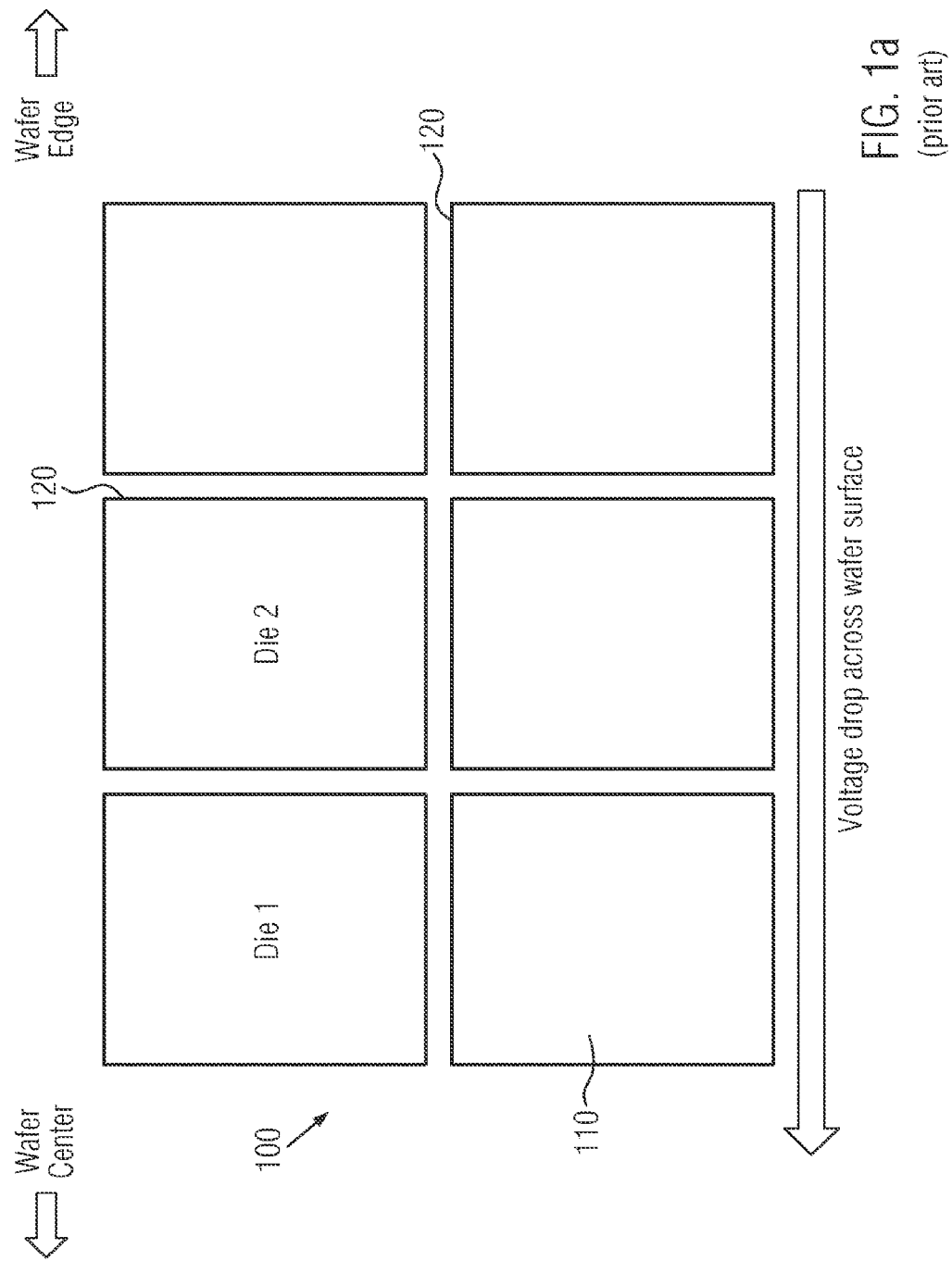
FIGS. 1a and 1b show a typical wafer to be plated with copper interconnects according to the art.
Figure 1B:
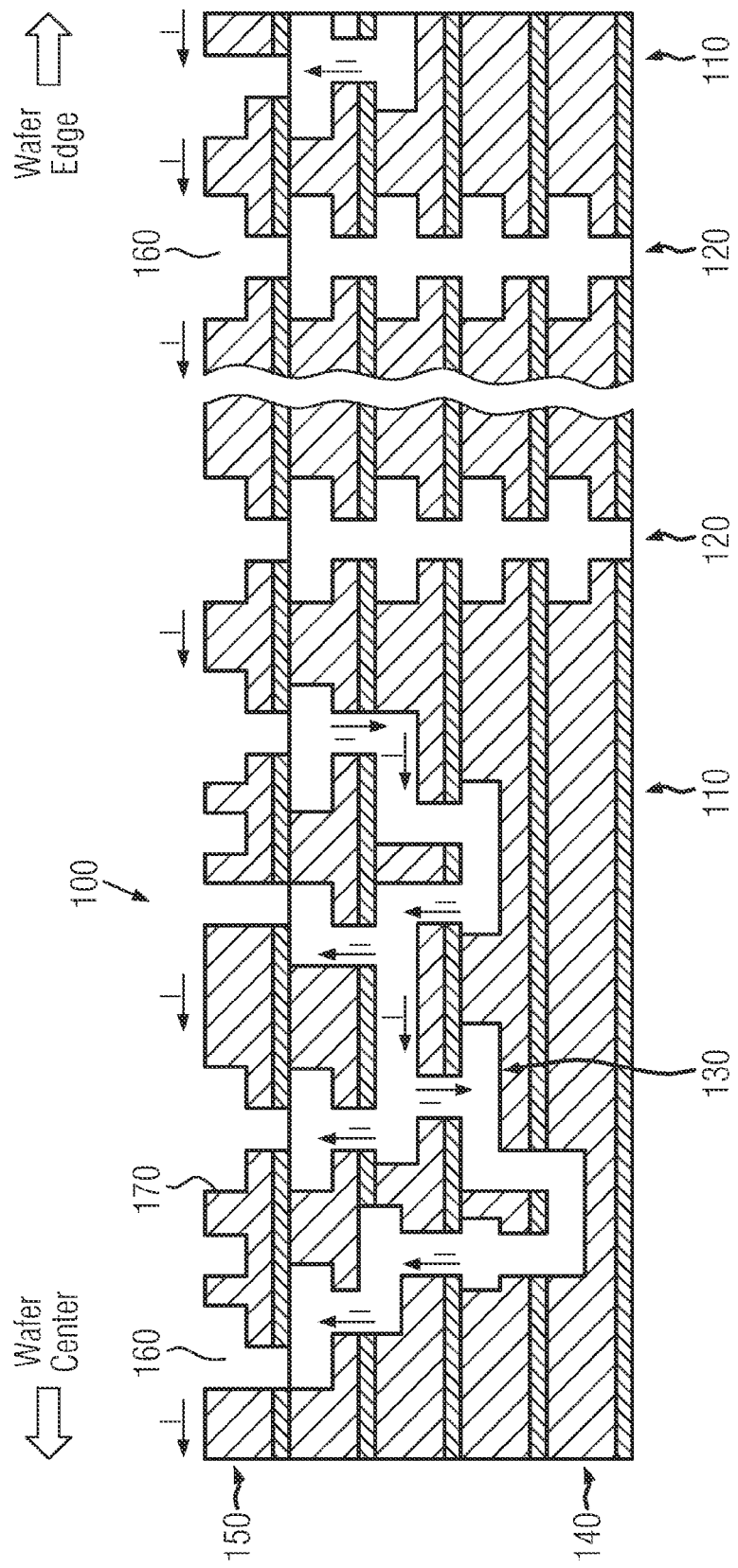

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure provides methods for forming a capacitor, in particular, in the context of a replacement gate technique for forming transistors. As will be readily apparent to those skilled in the art upon a complete reading of the present application, the present method is applicable to a variety of technologies, for example, NMOS, PMOS, CMOS, etc., and is readily applicable to a variety of devices, including, but not limited to, logic devices, memory devices, etc. The techniques and technologies described herein can be utilized to fabricate MOS integrated circuit devices, including NMOS integrated circuit devices, PMOS integrated circuit devices, and CMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor substrate.

Further embodiments will be described with reference to the drawings. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2:
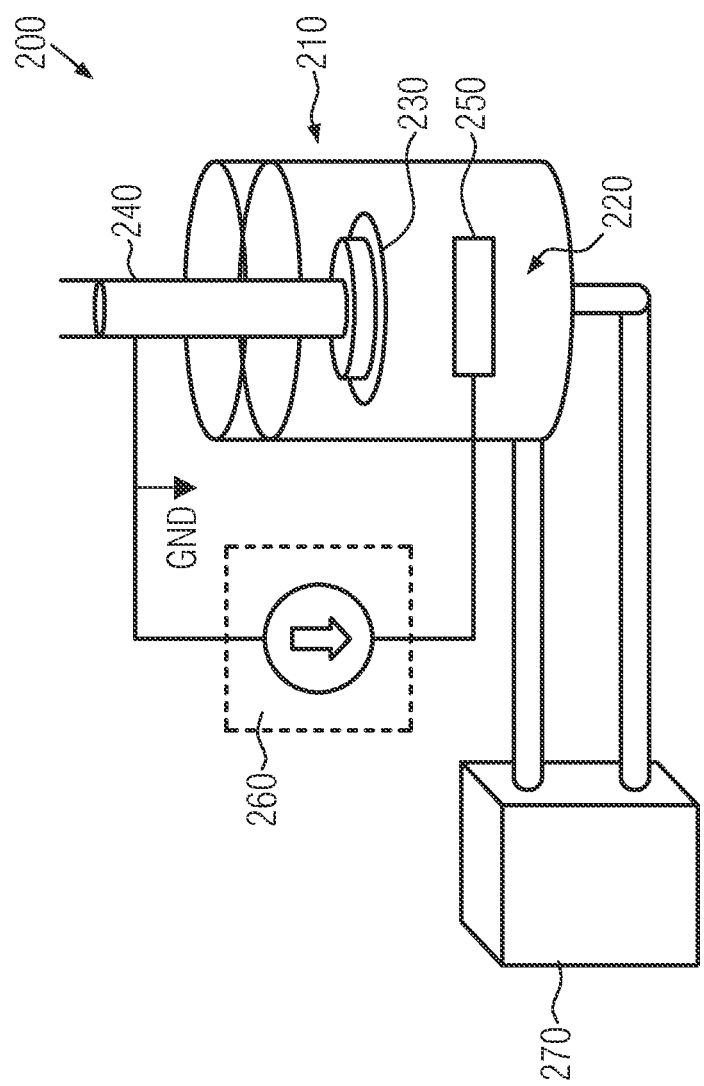
FIG. 2 shows a plating tool that can be used for copper plating of an example of the inventive wafer.

Herein, it is provided a particular wafer structure for copper plating. The wafer structure can suitably be copper-plated in an electroplating tool 200 shown in FIG. 2. Copper plating may result in a copper or copper-based material filling openings formed in the surface of the wafer. The electroplating tool 200 comprises an electrochemical cell (bath) 210 wherein an electrolyte 220 is filled. The electrolyte may comprise $CuSO_4$, for example. A wafer 230 is held by a wafer holder 240 that may comprise a cathode. Alternatively, a cathode is provided separately from the holder and attached to the wafer 230. The cathode can be a ring cathode comprising, for example, four cathode rings. For example, a cathode can be applied at the perimeter of a substrate of the wafer to a copper seed layer formed on the surface of the wafer that is to be plated in the electrochemical bath. Moreover, an anode 250 is immersed in the electrolyte 220. The anode 250 can also be configured as a ring electrode comprising, for example, four rings. Each of the rings of the cathode and anode 250 can be separately controlled. The cathode and anode 250 are connected to some electrical power supply 260. The electrolyte is supplied and removed by a pump 270. The anode 250 can be provided as an inert anode, for example, made of Ti or Pb, or copper anode, in principle.

The basic composition of the copper bath can vary widely. For example, an aqueous solution can be used with the following composition: Copper sulfate ($CuSO_4.5H_2O$): 20-250 g/l, sulfuric acid 50-350 g/l and chloride ions 0.01-0.18 g/l. Moreover, the electrolyte bath may contain additives for controlling the physical-mechanical properties of the copper interconnects to be formed. Polymeric oxygen containing compositions and/or organic sulfur compounds may be used as additives.

The surface of a wafer comprising patterns due to formed openings as vias and trenches can be copper plated by the electroplating tool 200. For example, a pulsed current is created by a suitable pulse generator. In the pulsed-current procedure, the current is set galvano-statically between the work pieces that are polarized as cathodes (such as printed circuit boards) and the anodes and modulated by suitable means. The voltage between the cathodes and anodes occurs automatically. In the pulsed-voltage procedure, a voltage is set potentio-statically between the work pieces and the anodes and modulated over time to produce a voltage that can be modulated over time. In this case, the current arises automatically.

The pulsed current generator can generate cathodic and anodic current pulses and can also briefly set the current to zero. The anodic pulses should be at least as strong as the cathodic pulses. The anodic pulses are preferably two to three times stronger than the cathodic current pulses. Overall, the charge that flows during the (cathodic) deposition phase should be much larger than the charge in the anodic phase.

The pulses could be 0.1 ms-1 s. Preferred pulse durations are 0.3 ms-30 ms; the cathodic pulses are preferably 10 ms-30 ms, and the anodic current pulses are 0.3 ms-10 ms and especially 0.3 ms-3 ms. A particularly favorable current modulation is as follows: The cathodic phase may last 10 ms, and the anodic phase lasts 0.5 ms. The setting can be improved by putting a pause (5 ms) or an anodic pulse (1 ms) between cathodic pulses (5 ms). Several cathodic or anodic pulses can be set to different strengths in a cycle. Devices to create such types of modulation are prior art.

The deposition bath is moved by a strong incident flow and possibly by blowing in clean air to strongly agitate the bath surface. This maximizes the transport of materials to the cathodes and anodes so that higher current densities are possible. Moving the cathodes also helps transport substances to the respective surfaces. The higher convection and electrode movement produces a constant, diffusion-controlled deposition. The substrates can move horizontally, vertically and/or by vibration. It is particularly effective to both move the substrates and blow air into the deposition bath. The copper consumed in the deposition process is replenished electrochemically by the copper anodes. Copper containing 0.02-0.067 percent by weight phosphorus is used for the anodes. As needed, filters can be provided in the electrolyte circuits to remove mechanical and/or chemical residue. The need for filters is less in comparison to electrolytic cells with soluble anodes since the sludge arising from the phosphorus in the anodes is not formed. Normally, coating systems may be used in which the treated specimen is held vertically or horizontally during deposition.

Chemical mechanical polishing is performed to remove excess copper or copper-based material to planarize the wafer surface after electrodeposition of the copper material. Chemical mechanical polishing removes the excessive copper material by physical grinding by means of a slurry containing abrasive particles as silica in combination with chemical action as a result of oxidizing agents such as hydrogen peroxide contained in the slurry. Before the chemical mechanical polishing, an anneal treatment may be carried out in order to increase the grain sized of the electrodeposited copper or copper-based material and improve the bonding of the same to the barrier layer, for example.

Figure 3A:
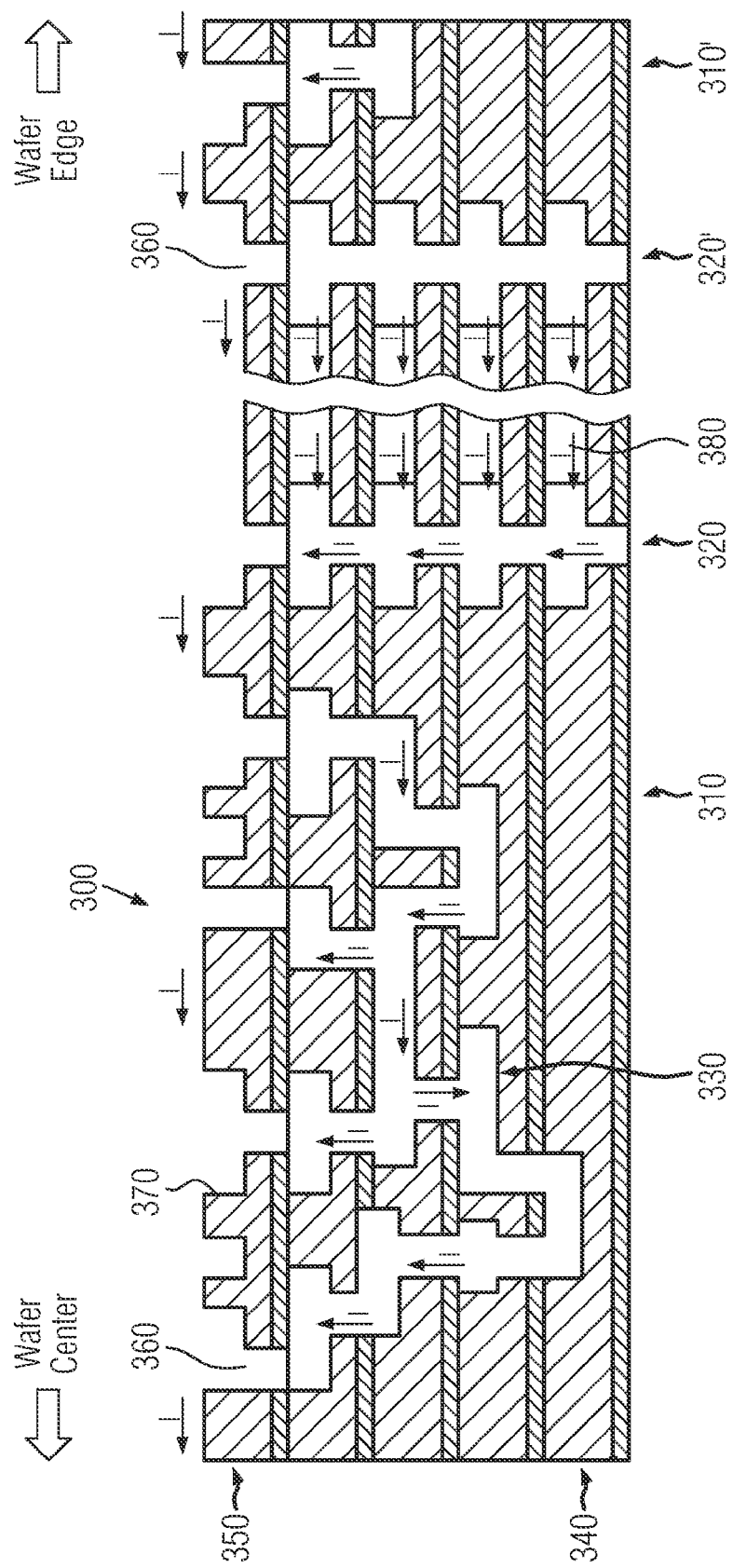

A wafer according to an example of the present invention is illustrated in FIG. 3a. The wafer 300 comprises a first die 310 and a second die 310'. The first die 310 is laterally enclosed by a first die seal (ring) 320 and the second die 310' is laterally enclosed by a second die seal (ring) 320'. Both dies 310 and 310' comprise multiple electrically conducting structures (metal structures) 330 formed in multiple metallization layers 340. The metallization layers 340 may include an (interlayer) dielectric layer. The dielectric layers may be formed by chemical vapor deposition or a plasma enhanced version thereof and may have a thickness of some 100 to 500 nm, for example.

The dielectric layer can include an electrically insulating material, for example, silicon dioxide and/or silicon nitride. For example, the dielectric layer can include fluorine-doped silicon dioxide, carbon-doped silicon dioxide, porous silicon dioxide, porous carbon-doped silicon dioxide, SiCOH, a polymeric dielectric such as polyimide, polynorbornenes, benzocyclobutene and/or polytetraflouroethylene, or a silicon-based polymeric dielectric, for example hydrogen silsesquioxane and/or methylsilsesquioxane. In particular, the (interlayer) dielectric layer may consist of or comprise an ultra low-k (ULK) material with k (dielectric constant)<2.8 or k of at most 2.4.

Both dies 310 and 310' have upper layers 350 containing a dielectric material, for example, silicon dioxide. The upper layers have openings 360 in form of vias or trenches, for example. Electrical connection to electrically conductive structures 330 have to be formed by electroplating of a copper material. In order to facilitate the copper plating process, a copper seed layer 370 is formed on the surfaces of the dies 310 and 310'. The seed layer 370 may be formed on some barrier layer (not shown), for example, made of Wn, Co, Ru, Ta, TaN or TiN. The barrier layer may be deposited by plasma vapor deposition. The seed layer 370 may be deposited by plasma or chemical vapor deposition. Uniformity of the deposited seed layer is important since non-uniformities can undesirably result in voids. It is also important that the free surface of the seed layer is substantially free of oxides for an efficient charge transfer during electroplating. This can be achieved, for example, by forming a thin (1 to 2 nm) acid-soluble oxide layer on top of the seed layer that is chemically removed in a copper plating bath. The thickness of the barrier layer may be some 50 nm and the thickness of the copper seed layer may be some 100 nm, for example.

For example, the seed layer 370 contains or consists of a copper-based nitride material. The copper-based seed layer 370 may be comprised of pure copper, or a copper alloy, including, for example, copper-aluminum, copper-cobalt, copper-manganese, copper-magnesium, copper-tin and copper-titanium, with alloy concentration ranging from 0.1 atomic percent to about 50 atomic percent based on application. In general, the copper-based seed layer 370 may be formed such that a first portion thereof that is positioned above the bottom of a trench/via formed in the upper layer 350 has a greater thickness than second portions positioned above the sidewalls of the trench/via.

Both dies 310 and 310' may include a plurality of field effect transistors (N-channel and/or P-channel transistors) and/or bipolar transistors and passive devices such as resistors, inductors and/or capacitors (not shown). Electrical connections for operating the devices are provided by the electrically conducting structures 330 formed in the multiple metallization layers 340.

Such devices may be formed on a semiconductor substrate. The semiconductor substrate can include a bulk semiconductor substrate formed of a semiconductor material, for example, a silicon wafer or silicon die. In other embodiments, the semiconductor substrate can include a semiconductor-oninsulator substrate including a layer of a semiconductor material, for example a silicon layer, that is formed above a support substrate, which can be a silicon wafer, and is separated therefrom by a layer of an electrically insulating material, for example a silicon dioxide layer. Particularly, the semiconductor substrate may comprise a semiconductor layer, which in turn may be comprised of any appropriate semiconductor material, such as silicon, silicon/germanium, silicon/carbon, other II-VI or III-V semiconductor compounds and the like.

The semiconductor layer may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon and the like. The semiconductor substrate can be a silicon substrate, in particular, a single crystal silicon substrate. Other materials can be used to form the semiconductor substrate such as, for example, germanium, silicon germanium, gallium phosphate, gallium arsenide, etc.

The dies 310 and 310' are separated from each other by die seals 320 and 320' as illustrated in FIG. 3a. The die seals 320 and 320' are formed, for example, continuously around the perimeter of the dies 310 and 310' or integrated circuits of the dies 310 and 310'. Each of the die seals 320 and 320' may include a crack stop structure designed to prevent crack propagation when dicing the wafer and a moisture oxidation barrier designed to reduce moisture ingression into the active die area during the dice process, package and assembly process. The crack stop structure is particularly designed to prevent crack propagation between different metal layers. The moisture oxidation barrier may be arranged closer to the center of the die than the crack stop structure. The crack stop structure may be neighbored to the edge of the die by a saw street area facilitating the dicing process.

The overall structure of the crack stop structure may include metal lines/layers that are structurally and electrically connected to each other through metal vias formed in dielectric layers. The crack stop structure may include a plurality of stacked alternating metal layers and dielectric layers overlying the wafer substrate. The crack stop structure may also include a pre-metal dielectric layer disposed between the substrate and a first metal layer of the die. The dielectric layers disposed between two successive metal layers are referred to as inter-level dielectric (ILD) layers. Extending between each adjacent pair of metal layers may be one or more vias formed in the dielectric layers positioned between each respective pair of metal layers and filled with metal. The ILD layers and the pre-metal dielectric layer may be formed of one or more insulating materials, for example, an oxide, an organo-silicate glass, organic or inorganic, low-k dielectric constant material (k<4) or ultra low-k dielectric constant material (k<2.5). The metal layers and the metal vias may be formed of copper, tungsten, aluminum, silver, gold, other metals, or alloys thereof. The same or different metals may be used for the metal layers and the vias.

The configuration of the moisture oxidation barrier may be similar in materials and structure to the crack stop structure. The moisture oxidation barrier may include the same plurality of stacked alternating metal layers and dielectric layers overlying the substrate of the die, and may also include the above-mentioned pre.-metal dielectric layer disposed between the substrate and a first metal layer. A different number of metal and dielectric layers may be utilized to form the moisture oxidation barrier. Further, the size and number of the metal vias in the moisture oxidation barrier may be the same as or different from those in the crack stop structure. Similarly, the moisture oxidation barrier may include any number of metal layers and dielectric layers disposed therebetween, as desired for a particular application.

In the examples shown in FIGS. 3a and 3b, the die seals 320 and 320' of the dies 310 and 310' are electrically connected with each other by means of electrically conductive links 380. The conductive links may be made of copper, aluminum, tungsten or any alloy thereof, for example. By electrically connecting the die seals 320 and 320', a low resistance connection between adjacent dies 310 and 310' (die seals 320 and 320') is established. This low resistance connection allows for higher plating currents to be delivered to the die surfaces during copper plating. In particular, a voltage drop across the wafer surface (from the edge to the center of the wafer) is reduced as compared to the art, thereby, resulting in more uniform plating conditions at the wafer surface.

Further, by providing the conductive links 380, it is made possible to intentionally make use of the electrically conducting structures 330 formed in the metallization layers of the dies 310 and 310' for distributing the plating current as it is illustrated by the arrows indicating current flow in FIGS. 3a and 3b. Thus, due to the enhanced homogeneity of the plating current, more reliable copper interconnects can be formed as compared to the art that does not know about conductive links between individual dies (die seals).

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A method of manufacture of a semiconductor wafer, comprising the steps of:
    forming a first integrated circuit on a first die of said semiconductor wafer and forming a second integrated circuit on a second die of said semiconductor wafer;
    forming a first die seal on said semiconductor wafer at the perimeter of said first die and a second die seal on said semiconductor wafer at the perimeter of said second die; and
    forming an electrically conductive link between said first and the second die seals.

2. The method of claim 1, further comprising forming a plurality of metallization layers in said semiconductor wafer and forming a plurality of electrically conductive links within said plurality of metallization layers.

3. The method of claim 1, wherein said electrically conductive links are made of copper, aluminum, tungsten or any alloy thereof.

4. The method of claim 1, further comprising forming a plurality of electrically conducting structures for electrically contacting semiconductor devices of each of said first and second integrated circuits.

5. The method of claim 1, wherein forming said first and second integrated circuits comprises forming field effect transistor devices.

6. The method of claim 1, further comprising electroplating the surface of said semiconductor wafer with a copper-based material to form an interconnect layer.

7. The method of claim 6, further comprising forming at least one of vias and trenches in said semiconductor wafer and filling said at least one of said vias and trenches by said electroplating.

8. A method of electroplating a semiconductor wafer, comprising the steps of:
providing a semiconductor wafer comprising a plurality of dies, each of said plurality of dies comprising a plurality of semiconductor devices, a plurality of die seals, each of said plurality of die seals being formed at a perimeter of one of said plurality of dies, and a plurality of electrically conductive links, each of said plurality of electrically conductive links connecting one of said plurality of die seals with another one of said plurality of die seals;
immersing said semiconductor wafer in an electrolyte bath containing copper;
applying a cathode to an edge of said semiconductor wafer;
immersing an anode in said electrolyte bath; and
applying a voltage to at least one of said cathode and said anode to deposit a copper-based material on the surface of said semiconductor wafer.

9. The method of claim 8, further comprising distributing uniformly an electrical current applied to said semiconductor wafer during said electroplating by means of said electrically conductive links.

10. The method of claim 8, wherein said semiconductor wafer further comprises a plurality of electrically conducting structures formed in a plurality of metallization layers of said plurality of dies and further comprising distributing uniformly an electrical current applied to said semiconductor wafer during said electroplating by means of said electrically conductive links and said electrically conducting structures.

11. The method of claim 8, wherein said copper-based material fills at least one of vias and trenches formed in said semiconductor wafer.

12. A method of manufacture of a semiconductor wafer, comprising the steps of:
forming a first integrated circuit on a first die of said semiconductor wafer and forming a second integrated circuit on a second die of said semiconductor wafer;
forming a first die seal on said semiconductor wafer at the perimeter of said first die and a second die seal on said semiconductor wafer at the perimeter of said second die;
forming an electrically conductive link between said first and the second die seals; and
performing at least one process on said semiconductor wafer, wherein during said at least one process, current flows through said electrically conductive line between said first and second die seals.

13. The method of claim 12, further comprising forming a plurality of metallization layers in said semiconductor wafer and forming a plurality of electrically conductive links within said plurality of metallization layers.

14. The method of claim 12, wherein said electrically conductive links are made of copper, aluminum, tungsten or any alloy thereof.

15. The method of claim 14, further comprising forming a plurality of electrically conducting structures for electrically contacting semiconductor devices of each of said first and second integrated circuits.

16. The method of claim 12, wherein forming said first and second integrated circuits comprises forming field effect transistor devices.

17. The method of claim 12, wherein said at least one process comprises electroplating the surface of said semiconductor wafer with a copper-based material to form an interconnect layer.

18. The method of claim 17, further comprising forming at least one of vias and trenches in said semiconductor wafer and filling said at least one of said vias and trenches by said electroplating.

* * * * *